US009128127B2

(12) United States Patent
Ariyama et al.

(10) Patent No.: US 9,128,127 B2
(45) Date of Patent: Sep. 8, 2015

(54) SENSOR DEVICE

(71) Applicant: Seiko Instruments Inc., Chiba-shi, Chiba (JP)

(72) Inventors: Minoru Ariyama, Chiba (JP); Daisuke Muraoka, Chiba (JP); Tomoki Hikichi, Chiba (JP); Kentaro Fukai, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 0 days.

(21) Appl. No.: 14/490,377

(22) Filed: Sep. 18, 2014

(65) Prior Publication Data

US 2015/0022241 A1      Jan. 22, 2015

Related U.S. Application Data

(63) Continuation of application No. PCT/JP2013/051704, filed on Jan. 28, 2013.

(30) Foreign Application Priority Data

Mar. 22, 2012    (JP) .................................. 2012-066004

(51) Int. Cl.
    *G01R 17/02*      (2006.01)
    *G01R 33/07*      (2006.01)
    *G01R 33/00*      (2006.01)
    *H03K 17/95*      (2006.01)
    *H03K 5/24*       (2006.01)

(52) U.S. Cl.
    CPC ............ *G01R 17/02* (2013.01); *G01R 33/0029* (2013.01); *G01R 33/07* (2013.01); *H03K 5/24* (2013.01); *H03K 17/9517* (2013.01)

(58) Field of Classification Search
    None
    See application file for complete search history.

(56) References Cited

U.S. PATENT DOCUMENTS

| 8,193,807 B2 * | 6/2012 | Muraoka et al. ............... 324/251 |
| 8,866,474 B2 * | 10/2014 | Muraoka et al. ............... 324/244 |
| 2015/0040687 A1 * | 2/2015 | Ariyama et al. ............... 324/244 |

FOREIGN PATENT DOCUMENTS

| JP | 2001-337147 A | 12/2001 |
| JP | 2004-340782 A | 12/2004 |
| JP | 2010-281801 A | 12/2010 |
| JP | 2010-283522 A | 12/2010 |

OTHER PUBLICATIONS

International Search Report in corresponding International Application No. PCT/JP2013/051704, dated Apr. 16, 2013, 1 page.

* cited by examiner

*Primary Examiner* — Long Nguyen

(74) *Attorney, Agent, or Firm* — Brinks Gilson & Lione

(57) ABSTRACT

Provided is a sensor device capable of removing the influence of each offset voltage of a sensor element, a differential amplifier, and an amplifier of the sensor device, to thereby detect a physical quantity with high precision. The sensor device includes: a switch circuit, which is connected to a first terminal pair and a second terminal pair of the sensor element, for controlling switching of the terminal pairs and outputting detection voltages; a differential amplifier, which includes a first input terminal and a second input terminal connected to a first output terminal and a second output terminal of the switch circuit, respectively, for outputting a result obtained by amplifying a difference of the detection voltages; an amplifier including at least two differential input pairs, one of which inputs the differential signal output from the differential amplifier, and at least one of which inputs a reference signal corresponding to a physical quantity to be detected; and a detection voltage setting circuit for outputting the reference signal to the amplifier.

6 Claims, 7 Drawing Sheets

SENSOR DEVICE

RELATED APPLICATIONS

This application is a continuation of PCT/JP2013/051704 filed on Jan. 28, 2013, which claims priority to Japanese Application No. 2012-066004 filed on Mar. 22, 2012. The entire contents of these applications are incorporated herein by reference.

TECHNICAL FIELD

The present invention relates to a sensor device for detecting a physical quantity and converting the detected physical quantity, such as magnetic field intensity, into an electric signal.

BACKGROUND ART

A magnetic sensor device is used as a sensor for detecting an open/close state in a flip mobile phone, a notebook computer, or the like and as a sensor for detecting a rotary position of a motor or the like (see, for example, Patent Literature 1). FIG. 15 illustrates a circuit diagram of the magnetic sensor device. In the magnetic sensor device, a magnetoelectric conversion element (such as Hall element) outputs a voltage corresponding to (typically, substantially proportional to) magnetic field intensity (or magnetic flux density), the output voltage is amplified by an amplifier, and a comparator is used to determine whether the amplified output voltage is larger or smaller than a predetermined magnetic field intensity or magnetic flux density (the result is output as a binary value, H signal or L signal).

In general, the output voltage of the magnetoelectric conversion element is minute, and hence there is a problem in that an error may occur due to an offset voltage of the magnetoelectric conversion element (element offset voltage), an offset voltage of the amplifier or the comparator (input offset voltage), and noise of those components, and the accuracy may be lower. The element offset voltage is generated mainly by stress on the magnetoelectric conversion element received from a package. The input offset voltage is generated mainly by characteristic fluctuations in elements of an input circuit of the amplifier or the comparator. The noise is generated mainly by flicker noise of a single transistor of the circuit or thermal noise of a single transistor or a resistive element.

The magnetic sensor device illustrated in FIG. 15 is configured as follows in order to reduce the influence of the offset voltages of the magnetoelectric conversion element and the amplifier. The magnetic sensor device includes a Hall element 1501, a switch circuit 1502 for switching the Hall element 1501 between a first detection state and a second detection state, a differential amplifier circuit 1503 for amplifying a voltage difference (V1−V2) of two output terminals of the switch circuit 1502, a capacitor 1504 having one end connected to one output terminal of the differential amplifier circuit 1503, a switch 1506 connected between the other output terminal of the differential amplifier circuit 1503 and the other end of the capacitor 1504, and a comparator 1505.

In this case, in the first detection state, a power supply voltage is input from terminals A and C, and a detection voltage is output from terminals B and D. In the second detection state, the power supply voltage is input from the terminals B and D, and a detection voltage is output from the terminals A and C. A differential signal voltage (hereinafter referred to as "element signal voltage") of the Hall element 1501 corresponding to the magnetic field intensity is represented by Vh, an offset voltage (hereinafter referred to as "element offset voltage") of the Hall element 1501 is represented by Voh, the gain of the differential amplifier circuit 1503 is represented by G, and an input offset voltage of the differential amplifier circuit 1503 is represented by Voa. The element signal voltages Vh in the first detection state and the second detection state are represented by Vh1 and Vh2, respectively, and the element offset voltages Voh in the first detection state and the second detection state are represented by Voh1 and Voh2, respectively.

The element offset voltages of the Hall element 1501 may be canceled out by a known method, typically called "spinning current". Specifically, the switch circuit is switched so as to obtain an element offset component that is reverse in phase to a common-mode signal component (or an element offset component that is in-phase to a normal-mode signal component), thereby cancelling out the offset components. Due to the spinning current, Vh2 becomes substantially equal to Vh1, and Voh2 becomes substantially equal to Voh1. V1−V2=Vh1+Voh1 is established in the first detection state, and V1−V2=−Vh2+Voh2 is established in the second detection state.

In the first detection state, the switch 1506 is turned ON, and Vc1=(V3−V4)=G×(V1−V2)=G×(Vh1+Voh1+Voa) is charged in the capacitor 1504. Subsequently, in the second detection state, the switch 1506 is turned OFF, and V3−V4=G×(V1−V2)=G×(−Vh2+Voh2+Voa) is output from the differential amplifier circuit 1503.

From the above, a differential input voltage of the comparator 1505 in the second detection state is determined as follows.

$$V5 - V6 = (V3 - Vc1) - V4$$
$$= (V3 - V4) - Vc1$$
$$= G \times (-Vh2 + Voh2 + Voa) - G \times (Vh1 + Voh1 + Voa)$$
$$= G \times (-Vh1 - Vh2) + G \times (Voh2 - Voh1)$$

The influence of the input offset voltage is canceled out, and because Voh2 is substantially equal to Voh1, the influence of the element offset voltage is also canceled out.

In this manner, a compact and inexpensive magnetic sensor can be realized, which is capable of obtaining an output with small fluctuations without being affected by the input offset voltage.

CITATION LIST

Patent Literature

[PTL 1] JP 2001-337147 A

SUMMARY OF THE INVENTION

In the related-art magnetic sensor device as described above, however, the input offset voltage of the comparator 1505 cannot be removed, and hence there is a problem in that a fluctuation or an error occurs in detection magnetic field intensity due to a fluctuation in input offset voltage or a change in input offset voltage caused by stress or the like.

The present invention has been made in view of the above-mentioned circumstances, and it is an object thereof to provide a magnetic sensor device capable of removing the influence of element offset voltages and input offset voltages of an amplifier and a comparator by a simple circuit configuration and detecting magnetic field intensity with high precision.

In order to solve the related-art problems, a sensor device according to one embodiment of the present invention has the following configuration.

According to one embodiment of the present invention, there is provided a sensor device for generating a logic output in accordance with intensity of a physical quantity applied to a sensor element, the sensor device including: a switch circuit connected to a first terminal pair and a second terminal pair of the sensor element, for controlling switching between a terminal pair supplied with power and a terminal pair for outputting a detection voltage corresponding to the intensity of the physical quantity, the switch circuit including a first output terminal and a second output terminal for outputting the detection voltage; a differential amplifier including a first input terminal and a second input terminal that are connected to the first output terminal and the second output terminal of the switch circuit, respectively, and including a first output terminal and a second output terminal for outputting a result of differentially amplifying the detection voltage; an amplifier including a first input terminal, a second input terminal, a third input terminal, a fourth input terminal, and an output terminal, the first input terminal being connected to the output terminal via a first switch, the first input terminal being connected to the first output terminal of the differential amplifier via a first capacitor, the second input terminal being connected to the second output terminal of the differential amplifier; and a detection voltage setting circuit for outputting different voltages to the third input terminal and the fourth input terminal of the amplifier.

The sensor device according to one embodiment of the present invention effectively utilizes the switch and the capacitor, thereby being capable of removing offset components that are generated in the sensor element and the differential amplifier included in the sensor device with a simpler circuit configuration. Consequently, the detection voltage level of the intensity of the physical quantity can be accurately set, and hence a highly-precise sensor device can be provided.

DETAILED DESCRIPTION OF THE PREFERRED EMBODIMENTS

A sensor device of the present invention, such as a magnetic sensor device, is widely used as a sensor for detecting the state of magnetic field intensity, as represented by a sensor for detecting an open/close state in a flip mobile phone, a notebook computer, or the like or a sensor for detecting a rotary position of a motor or the like. Embodiments of the present invention are described below with reference to the accompanying drawings.

First Embodiment

Figure 1:
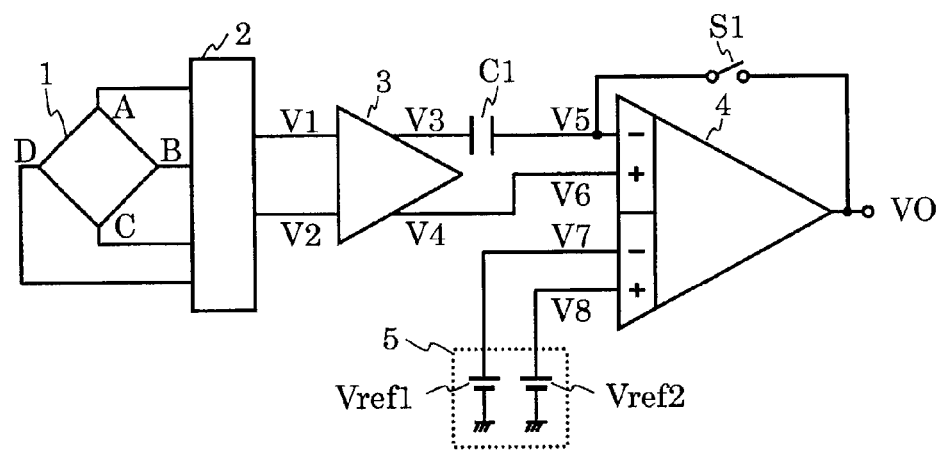
FIG. 1 is a circuit diagram of a magnetic sensor device according to a first embodiment of the present invention.

FIG. 1 is a circuit diagram of a magnetic sensor device according to a first embodiment of the present invention. The magnetic sensor device in the first embodiment includes a Hall element 1 serving as a magnetoelectric conversion element, a switch circuit 2, a differential amplifier 3, an amplifier 4, a capacitor C1, a switch S1, and a detection voltage setting circuit 5. The detection voltage setting circuit 5 includes a reference voltage setting circuit Vref1 and a reference voltage setting circuit Vref2.

The Hall element 1 includes a first terminal pair A-C and a second terminal pair B-D.

The switch circuit 2 includes four input terminals connected to the terminals A, B, C, and D of the Hall element 1, respectively, a first output terminal, and a second output terminal.

The differential amplifier 3 has a first input terminal V1, a second input terminal V2, a first output terminal V3, and a second output terminal V4. The first input terminal V1 and the second input terminal V2 are connected to the first output terminal and the second output terminal of the switch circuit 2, respectively.

The capacitor C1 has two terminals. One terminal is connected to the first output terminal V3 of the differential amplifier 3. The other terminal is connected to a first input terminal V5 of a first differential input pair of the amplifier 4.

The amplifier 4 has four input terminals and one output terminal. Specifically, the amplifier 4 has the first input terminal V5 and a second input terminal V6 of the first differential input pair, a first input terminal V7 and a second input terminal V8 of a second differential input pair, and an output terminal VO. The second input terminal V6 of the first differential input pair of the amplifier 4 is connected to the second output terminal V4 of the differential amplifier 3. The first input terminal V7 of the second differential input pair is connected to a positive terminal of the reference voltage setting circuit Vref1. The second input terminal V8 of the second differential input pair is connected to a positive terminal of the reference voltage setting circuit Vref2.

The switch S1 has two terminals. One terminal is connected to the first input terminal V5 of the first differential input pair of the amplifier 4. The other terminal is connected to the output terminal VO of the amplifier 4. The switch S1 is controlled to be turned ON or OFF in accordance with a switch control signal (not shown in the circuit diagram).

Next, the operation of the magnetic sensor device in the first embodiment is described below.

The switch circuit 2 has a function of switching between a first detection state and a second detection state. In the first detection state, a power supply voltage is input to the first terminal pair A-C of the Hall element 1, and a detection voltage is output from the second terminal pair B-D. In the second detection state, the power supply voltage is input to the second terminal pair B-D, and a detection voltage is output from the first terminal pair A-C.

The Hall element 1 outputs a signal voltage corresponding to magnetic field intensity (or magnetic flux density), and also outputs an offset voltage as an error component.

The differential amplifier 3 has a function of amplifying a difference between two input voltages and outputting the amplified difference as a difference between two output voltages. This amplifier function is represented as follows:

$$V3-V4=G\times(V1-V2) \quad (1)$$

where G is a gain, and V1 to V4 are voltages at the respective terminals V1 to V4. This function of the differential amplifier 3 is realized by a circuit configuration illustrated in FIG. 3, for example.

Figure 2:
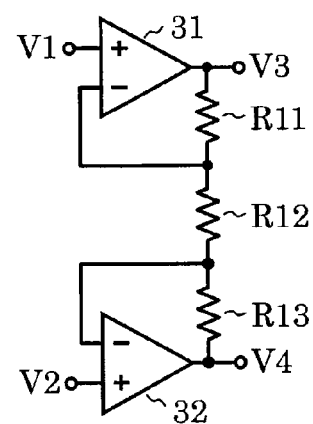
FIG. 2 is an exemplary circuit diagram of a differential amplifier used in the magnetic sensor device of the present invention.

FIG. 2 is a circuit diagram illustrating an example of the differential amplifier 3.

The differential amplifier 3 of FIG. 2 includes differential amplifiers 31 and 32 and resistors R11, R12, and R13, which are connected as follows. In the differential amplifier 3, the first input terminal V1 is connected to a non-inverting input terminal of the differential amplifier 31, the second input terminal V2 is connected to a non-inverting input terminal of the differential amplifier 32, the first output terminal V3 is connected to an output terminal of the differential amplifier 31, and the second output terminal V4 is connected to an output terminal of the differential amplifier 32. The resistors R11, R12, and R13 are connected in series between the first output terminal V3 and the second output terminal V4. A connection point V1' of the resistors R11 and R12 is connected to an inverting input terminal of the differential amplifier 31. A connection point V2' of the resistors R12 and R13 is connected to an inverting input terminal of the differential amplifier 32.

The differential amplifier 3 has the above-mentioned connections and operates as follows.

The differential amplifier 31 operates as a non-inverting amplifier so that the connection point V1' connected to the inverting input terminal may have a voltage substantially equal to the voltage V1 connected to the non-inverting input terminal. The differential amplifier 32 operates as a non-inverting amplifier so that the connection point V2' connected to the inverting input terminal may have a voltage substantially equal to the voltage V2 connected to the non-inverting input terminal. Equal currents flow through the resistors R11, R12, and R13, and hence the following expressions are obtained.

$$(V3-V1)/R11=(V1-V2)/R12 \quad (2)$$

$$(V2-V4)/R13=(V1-V2)/R12 \quad (3)$$

Based on Expression (2) and Expression (3), V3 and V4 are calculated as follows.

$$V3=+(R11/R12+1/2)\times(V1-V2)+(V1+V2)/2 \quad (4)$$

$$V4=-(R13/R12+1/2)\times(V1-V2)+(V1+V2)/2 \quad (5)$$

The terms in parentheses including the resistors on the right side of Expression (4) and Expression (5) are represented by "gains G1" and "gain G2", respectively, as follows.

$$G1=R11/R12+1/2 \quad (6)$$

$$G2=R13/R12+1/2 \quad (7)$$

Then, Expression (4) and Expression (5) are modified as follows.

$$V3=+G1\times(V1-V2)+(V1+V2)/2 \quad (8)$$

$$V4=-G2\times(V1-V2)+(V1+V2)/2 \quad (9)$$

Based on Expression (8) and Expression (9), V3−V4 is calculated as follows.

$$V3-V4=(G1+G2)\times(V1-V2) \quad (10)$$

When the gain G is given as follows, $$G=G1+G2 \quad (11)$$

Expression (11) is modified as follows, $$V3-V4=G\times(V1-V2) \quad (12)$$

to be the same result as Expression (1). In other words, the circuit exemplified in FIG. 2 has the function of amplifying a difference between two input voltages and outputting the amplified difference as a difference between two output voltages. Further, the circuit exemplified in FIG. 2 is configured as such an instrument amplifier to suppress an influence of in-phase noise at input. Note that, Expression (13) is obtained based on Expressions (11), (6), and (7).

$$G=(R11+R12+R13)/R12 \quad (13)$$

Thus, the gain G may be set arbitrarily based on the resistors R11, R12, and R13.

The amplifier 4 has a function of outputting the sum of a value obtained by amplifying the difference of one pair of input voltages and a value obtained by amplifying the difference of another pair of input voltages. This amplifying function is conceptually illustrated in FIG. 3.

Figure 3:
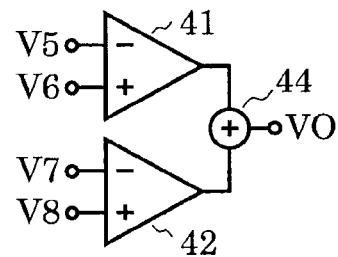
FIG. 3 is an exemplary circuit diagram of an amplifier used in the first embodiment.

FIG. 3 is a conceptual diagram illustrating the function of the amplifier 4.

The amplifier 4 of FIG. 3 includes differential amplifiers 41 and 42 and an adder 44, and is connected as follows. In the amplifier 4, the first input terminal V5 of the first differential input pair is connected to an inverting input terminal of the differential amplifier 41, the second input terminal V6 of the first differential input pair is connected to a non-inverting input terminal of the differential amplifier 41, the first input terminal V7 of the second differential input pair is connected to an inverting input terminal of the differential amplifier 42, and the second input terminal V8 of the second differential input pair is connected to a non-inverting input terminal of the differential amplifier 42. An output of the differential amplifier 41 and an output of the differential amplifier 42 are connected to inputs of the adder 44, respectively. An output of the adder 44 is connected to the output terminal VO of the amplifier 4.

The amplifier 4 is connected as described above, and operates as follows.

The differential amplifier 41 amplifies a voltage difference between the two input terminals V5 and V6 and inputs the amplified voltage difference to the adder 44. The differential amplifier 42 amplifies a voltage difference between the two input terminals V7 and V8 and inputs the amplified voltage difference to the adder 44. The adder 44 outputs the sum of the outputs of the differential amplifier 41 and the differential amplifier 42. This amplifying function is expressed by Expression (14).

$$VO=A1\times(V6-V5)+A2\times(V8-V7) \quad (14)$$

where A1 and A2 represent the gains of the differential amplifiers 41 and 42, and V5 to V8 and VO represent the voltages at the terminals V5 to V8 and VO, respectively.

In the magnetic sensor device of FIG. 1, the first input terminal V5 of the first differential input pair and the output terminal VO of the amplifier 4 illustrated in FIG. 3 are respectively connected to both terminals of the switch S1.

When the switch S1 is turned ON, VO and V5 are substantially equal voltages, and hence VO is expressed as follows based on Expression (15).

$$VO=A1/(1+A1)\times V6+A2/(1+A1)\times(V8-V7) \quad (15)$$

For the sake of description, the gains A1 and A2 are assumed to be sufficiently large. Then, the following expression is obtained.

$$VO=V6+(A2/A1)\times(V8-V7) \quad (16)$$

Specifically, when the switch S1 is turned ON, the output terminal VO of the amplifier 4 is electrically connected to the inverting input terminal of the differential amplifier 41 via the first input terminal V5 of the first differential input pair, to thereby form a feedback loop. Thus, the output voltage VO follows the input voltage V6, and becomes the sum of the input voltage V6 and a voltage obtained by amplifying the voltage difference between the inputs V8 and V7 by the ratio of the gains A2 and A1. In other words, the amplifier 4 operates like a voltage follower.

On the other hand, when the switch S1 is turned OFF, the feedback loop is not formed in the amplifier 4, and hence VO operates as a comparator. Based on Expression (14), Expression (17) is obtained.

$$VO=A1\times\{(V6-V5)+(A2/A1)\times(V8-V7)\} \quad (17)$$

Specifically, when the switch S1 is turned OFF, the amplifier 4 performs a comparison operation of amplifying, by the sufficiently large gain A1, the sum of a difference voltage between V6 and V5 and a voltage obtained by amplifying the difference between V8 and V7 by the ratio of the gains A1 and A2, and outputting a High level signal (typically, positive power supply voltage level) or a Low level signal (typically, negative power supply voltage level or GND level) to the output terminal VO.

Figure 4:
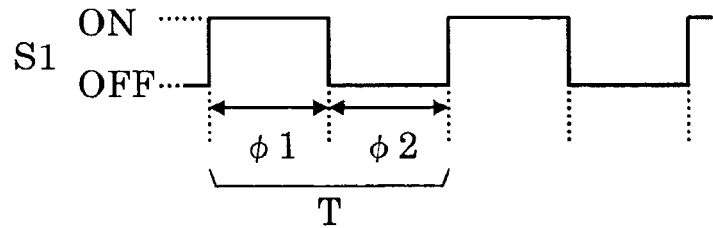
FIG. 4 is an exemplary timing chart of a switch control signal in the magnetic sensor device of the present invention.

FIG. 4 illustrates a timing chart of a switch control signal.

One period T of the detection operation is made up of a first phase φ1 and a second phase φ2. The switch S1 is controlled by the switch control signal of FIG. 4 to be turned ON in the first phase φ1 and OFF in the second phase φ2. The switch circuit 2 and the Hall element 1 are also controlled by the switch control signal of FIG. 4 to have a first detection state T1 in the first phase φ1 and a second detection state T2 in the second phase φ2. The outline of the operation of the magnetic sensor device of FIG. 1 in the respective phases is now described. The first phase φ1 is a phase in which the element signal voltage and the element offset voltage of the Hall element 1 and the offset voltages of the differential amplifier 3 and the amplifier 4 are stored in the capacitor C1. The second phase φ2 is a phase in which a voltage determined in accordance with magnetic field intensity indicated by the element signal voltage is compared to a detection voltage while cancelling out the offset components generated in the first phase φ1. The details are described below.

In the first phase φ1, the Hall element 1 is in the first detection state T1, and the switch S1 is turned ON. When the switch S1 is turned ON, the amplifier 4 operates like a voltage follower as described above. This is expressed as follows based on Expression (16).

$$V5\phi1=VO\phi1=V6\phi1+(A2/A1)\times(V8\phi1-V7\phi1) \quad (18)$$

"φ1" suffixed to each voltage means the voltage in the first phase φ1. In the following, the same notation applies to other voltages and the second phase φ2.

Further, a difference ΔVC1φ1 between the voltage V3 and the voltage V5 is charged in the capacitor C1.

$$\Delta VC1\phi1=V3\phi1-V5\phi1 \quad (19)$$

Expression (18) is substituted into the above expression to obtain the following expression.

$$\Delta VC1\phi1=V3\phi1-V6\phi1-(A2/A1)\times(V8\phi1-V7\phi1) \quad (20)$$

In this case, the connection is made so that V6=V4 is established, and the first input terminal V7 of the second differential input pair of the amplifier 4 is connected to the positive terminal of the reference voltage setting circuit Vref1 while the second input terminal V8 of the second differential input pair is connected to the positive terminal of the reference voltage setting circuit Vref2. Thus, when the voltages at the positive terminals of the respective reference voltage setting circuits are represented by Vref1 and Vref2, Expression (20) is expressed as the following expression.

$$\Delta VC1\phi1=(V3\phi1-V4\phi1)-(A2/A1)\times(Vref2\phi1-Vref1\phi1) \quad (21)$$

Based on Expression (12), Expression (22) is obtained.

$$V3\phi1-V4\phi1=G\times(V1\phi1-V2\phi1) \quad (22)$$

Expression (22) is substituted into Expression (21) to obtain the following expression.

$$\Delta VC1\phi1=G\times(V1\phi1-V2\phi1)-(A2/A1)\times(Vref2\phi1-Vref1\phi1) \quad (23)$$

In other words, a voltage difference between the voltage obtained by amplifying the difference between V1 and V2 by the gain G and the voltage obtained by amplifying the difference between Vref2 and Vref1 by the ratio of the gains A2 and A1 is charged in the capacitor C1.

On the other hand, in the second phase φ2, the Hall element 1 is in the second detection state T2, and the switch S1 is turned OFF. The voltage ΔVC1φ1 is charged in the capacitor C1, and hence the voltage V5 is expressed by the following expression.

$$V5\phi2=V3\phi2-\Delta VC1\phi1 \quad (24)$$

The output of the amplifier 4 is expressed by the following expression based on Expression (17).

$$VO\phi2=A1\times\{(V6\phi2-V5\phi2)+(A2/A1)\times(V8\phi2-V7\phi2)\} \quad (25)$$

As described above, the connection is made so that V6=V4 is established, and the first input terminal V7 of the second differential input pair of the amplifier 4 is connected to the positive terminal of the reference voltage setting circuit Vref1 while the second input terminal V8 of the second differential input pair is connected to the positive terminal of the reference voltage setting circuit Vref2. Thus, Expression (25) is modified as follows.

$$VO\phi2=A1\times\{(V4\phi2-V5\phi2)+(A2/A1)\times(Vref2\phi2-Vref1\phi2)\} \quad (26)$$

Expression (24) is substituted into this expression to obtain the following expression.

$$VO\phi2=A1\times\{(V4\phi2-V3\phi2)+(A2/A1)\times(Vref2\phi2-Vref1\phi2)\}+A1\times\Delta VC1\phi1 \quad (27)$$

The voltage $\Delta VC1\phi1$ charged in the capacitor C1, which is expressed by Expression (23), is substituted into the above expression to rearrange Expression (27), thereby obtaining the following expression.

$$VO\varphi2 = A1 \times \{(V4\varphi2 - V3\varphi2) + (A2/A1) \times (Vref2\varphi2 - Vref1\varphi2)\} + \quad (28)$$
$$A1 \times \{(V3\varphi1 - V4\varphi1) - (A2/A1) \times (Vref2\varphi1 - Vref1\varphi1)\} =$$
$$A1 \times [\{-(V3\varphi2 - V4\varphi2) + (V3\varphi1 - V4\varphi1)\} +$$
$$(A2/A1) \times \{(Vref2\varphi2 - Vref1\varphi2) - (Vref2\varphi1 - Vref1\varphi1)\}]$$

For easy understanding of Expression (28), when a voltage component that is supplied to the amplifier 4 via the differential amplifier 3 is represented by $\Delta Vsig$, and a voltage component that is supplied to the amplifier 4 from the reference voltage setting circuit is represented by $\Delta Vref$, Expression (28) is expressed as follows.

$$VO\phi2 = A1 \times [\Delta Vsig + (A2/A1) \times \Delta Vref] \quad (29)$$

In this case, the following expressions are established.

$$\Delta Vsig = -(V3\phi2 - V4\phi2) - (V3\phi1 - V4\phi1) \quad (30)$$

$$\Delta Vref = (Vref2\phi2 - Vref1\phi2) - (Vref2\phi1 - Vref1) \quad (31)$$

Specifically, the result of comparing the voltage component $\Delta Vsig$ supplied from the differential amplifier 3 to the voltage obtained by amplifying the voltage component $\Delta Vref$ supplied from the detection voltage setting circuit 5 by the ratio of the gains A1 and A2 is finally output as a High level signal or a Low level signal from the output terminal VO of the amplifier 4.

Based on Expression (12), Expression (32) is established.

$$V3\phi2 - V4\phi2 = G \times (V1\phi2 - V2\phi2) \quad (32)$$

Thus, Expression (32) and Expression (22) are substituted into Expression (30) to obtain the following expression.

$$\Delta Vsig = G \times \{(V1\phi2 - V2\phi2) - (V1\phi1 - V2\phi1)\} \quad (33)$$

Next, a description is given of the transmission of an effective signal component when a differential output voltage of the output terminal pair of the Hall element 1 is represented by Vh and a common-mode voltage thereof is represented by Vcm. The differential output voltage Vh is a signal voltage corresponding to magnetic field intensity.

In the first phase $\phi1$, the Hall element 1 is in the detection state T1, and the terminals V1 and V2 have the following voltages.

$$V1\phi1 = Vcm\phi1 + Vh\phi1/2 \quad (34)$$

$$V2\phi1 = Vcm\phi1 - Vh\phi1/2 \quad (35)$$

From the above expressions and Expression (23), the following expression is obtained.

$$\Delta VC1\phi1 = G \times Vh\phi1 - (A2/A1) \times (Vref2\phi1 - Vref1\phi1) \quad (36)$$

In the second phase $\phi2$, the Hall element 1 is in the detection state T2, and the terminals V1 and V2 have the following voltages.

$$V1\phi2 = Vcm\phi2 - Vh\phi2/2 \quad (37)$$

$$V2\phi2 = Vcm\phi2 + Vh\phi2/2 \quad (38)$$

Expressions (34), (35), (37), and (38) are substituted into Expression (33) to obtain the following expression.

$$\Delta Vsig = -G \times (Vh\phi2 + Vh\phi1) \quad (39)$$

Further, $\Delta Vref$ is determined similarly to Expression (31). Therefore, the voltage component $\Delta Vsig$ supplied to the amplifier 4 via the differential amplifier 3 is a signal component obtained by amplifying the signal voltage corresponding to signal intensity. In the second phase, the amplifier 4 compares the signal component $\Delta Vsig$ to the reference voltage component $\Delta Vref$ determined by the reference voltage setting circuit by the expression based on Expression (29), and outputs the comparison result to the terminal VO.

Next, a description is given of the transmission of an element offset component by performing the same calculation when the element offset voltage of the Hall element 1 is represented by Voh. In the above-mentioned calculation of the effective signal component, the output voltage components of the Hall element 1 are reverse in phase between the first detection state T1 and the second detection state T2, and hence the element offset components are in phase therebetween.

In the first phase $\phi1$, the Hall element 1 is in the detection state T1, and the terminals V1 and V2 have the following voltages.

$$V1\phi1 = Vcm\phi1 + Voh\phi1/2 \quad (40)$$

$$V2\phi1 = Vcm\phi1 - Voh\phi1/2 \quad (41)$$

From the above expressions and Expression (23), the following expression is obtained.

$$\Delta VC1\phi1 = G \times Voh\phi1 - (A2/A1) \times (Vref2\phi1 - Vref1\phi1) \quad (42)$$

In the second phase $\phi2$, the Hall element 1 is in the detection state T2, and the terminals V1 and V2 have the following voltages.

$$V1\phi2 = Vcm\phi2 + Vh\phi2/2 \quad (43)$$

$$V2\phi2 = Vcm\phi2 - Vh\phi2/2 \quad (44)$$

Expressions (40), (41), (43), and (44) are substituted into Expression (33) to obtain the following expression.

$$\Delta Vsig = G \times (Voh\phi2 - Voh\phi1) \quad (45)$$

In general, the element offset voltage Voh of the Hall element 1 is substantially equal between the first detection state and the second detection state, and hence the value of $Voh\phi2 - Voh\phi1$ is almost zero. In the comparison operation of the amplifier 4 in the second phase, the element offset component is removed to suppress the influence of the element offset voltage that appears in the output as the comparison result.

Next, a description is given of the transmission of an offset component of the amplifier when the input offset voltages of the differential amplifier 3 are represented by Voa1 for the first input terminal V1 and Voa2 for the second input terminal V2, and the input offset voltages of the respective differential input pairs of the amplifier 4 are represented by Voa3 for the second input terminal V6 of the first differential input pair and Voa4 for the second input terminal V8 of the second differential input pair.

In the first phase $\phi1$, the terminals V1 and V2 have the following voltages.

$$V1\phi1 = Vcm\phi1 \quad (46)$$

$$V2\phi1 = Vcm\phi1 \quad (47)$$

From Expression (22) and the above expressions, the following expression is obtained.

$$V3\varphi1 - V4\varphi1 = G \times (V1\varphi1 + Voa1\varphi1) - (V2\varphi1 + Voa2\varphi1) \quad (48)$$
$$= G \times (Voa1\varphi1 - Voa2\varphi1)$$

Further, from Expression (18), the following expression is obtained.

$$V5\phi1 = V6\phi1 + Voa3\phi1 + (A2/A1) \times (V8\phi1 + Voa4\phi1 - V7\phi1) \quad (49)$$

As described above, V6=V4, V7=Vref1, and V8=Vref2 are established, and hence Expression (49) can be expressed as follows.

$$V5\phi1 = V4\phi1 + Voa3\phi1 + (A2/A1) \times (Vref2\phi1 - Vref1\phi1 + Voa4\phi1) \quad (50)$$

Expression (50) is substituted into Expression (19) to obtain the following expression.

$$\Delta VC1\phi1 = (V3\phi1 - V4\phi1) - Voa3\phi1 - (A2/A1) \times (Vref2\phi1 - Vref1\phi1 + Voa4\phi1) \quad (51)$$

In the second phase φ2, the terminals V1 and V2 have the following voltages.

$$V1\phi2 = Vcm\phi2 \quad (52)$$

$$V2\phi2 = Vcm\phi2 \quad (53)$$

From Expression (33) and the above expressions, the following expression is obtained.

$$V3\varphi2 - V4\varphi2 = G \times (V1\varphi2 + Voa1\varphi2) - (V2\varphi2 + Voa2\varphi2) \quad (54)$$
$$= G \times (Voa1\varphi2 - Voa2\varphi2)$$

Further, from Expression (25), the following expression is obtained.

$$VO\phi2 = A1 \times \{(V6\phi2 + Voa3\phi2 - V5\phi2) + (A2/A1) \times (V8\phi2 + Voa4\phi2 - V7\phi2)\} \quad (55)$$

As described above, V6=V4, V7=Vref1, and V8=Vref2 are established, and hence Expression (55) can be expressed as follows.

$$VO\phi2 = A1 \times \{(V4\phi2 - V5\phi2 + Voa3\phi2) + (A2/A1) \times (Vref2\phi2 - Vref1\phi2 + Voa4\phi2)\} \quad (56)$$

From Expression (24), V5φ2=V3φ2−ΔVC1φ1 is established, and hence Expression (56) can be expressed as follows.

$$VO\phi2 = A1 \times \{(V4\phi2 - V3\phi2 + \Delta VC1\phi1 + Voa3\phi2) + (A2/A1) \times (Vref2\phi2 - Vref1\phi2 + Voa4\phi2)\} \quad (57)$$

ΔVC1φ1 in Expression (57) is the voltage charged in the capacitor C1 in the first phase φ1, and is expressed by Expression (51). ΔVC1φ1 is substituted into Expression (57) to obtain the following expression.

$$VO\phi2 = A1 \times [\{-(V3\phi2 - V4\phi2) + (V3\phi1 - V4\phi1) + (Voa3\phi2 - Voa3\phi1)\} + (A2/A1) \times \{(Vref2\phi2 - Vref1\phi2) - (Vref2\phi1 - Vref1\phi1) + (Voa4\phi2 - Voa4\phi1)\}] \quad (58)$$

Expressions (48) and (54) are substituted into Expression (58) to obtain the following expression.

$$VO\phi2 = A1 \times [G \times \{-(Voa1\phi2 - Voa1\phi1) + G \times (Voa2\phi2 - Voa2\phi1) + (Voa3\phi2 - Voa3\phi1)\} + (A2/A1) \times \{(Vref2\phi2 - Vref1\phi2) - (Vref2\phi1 - Vref1\phi1) + (Voa4\phi2 - Voa4\phi1)\}] \quad (59)$$

In order to compare the above expression to Expression (29), the voltage component ΔVsig supplied to the amplifier 4 via the differential amplifier 3 and the voltage component ΔVref supplied to the amplifier 4 from the detection voltage setting circuit 5 are introduced into Expression (59) to be modified as follows.

$$VO\phi2 = A1 \times [G \times \Delta Vsig + (A2/A1) \times \Delta Vref] \quad (60)$$

Expression (60) is the same as Expression (29). In Expression (60), the following expressions are established.

$$\Delta Vsig = \{-(Voa1\phi2 - Voa1\phi1) + G \times (Voa2\phi2 - Voa2\phi1) + (Voa3\phi2 - Voa3\phi1)\} \quad (61)$$

$$\Delta Vref = (Vref2\phi2 - Vref1\phi2) - (Vref2\phi1 - Vref1\phi1) + (Voa4\phi2 - Voa4\phi1) \quad (62)$$

In a strict sense, the offset voltages Voa1 to Voa4 of the differential amplifier 3 and the amplifier 4 have a temporal change or a temperature change (temperature drift). However, if the time periods of the first phase φ1 and the second phase φ2 are sufficiently short with respect to the temporal change or the temperature change of those offset voltages, the values of the offset voltages are regarded as values substantially equal between the first phase φ1 and the second phase φ2. Therefore, in Expression (59), the values of Voa1φ2−Voa1 φ1, Voa2φ2−Voa2φ1, Voa3φ2−Voa3φ1, and Voa4φ2−Voa4φ1 are almost zero, and hence the offset components of the differential amplifier 3 and the amplifier 4 are removed in the comparison operation of the amplifier 4 in the second phase.

In conclusion, as expressed by Expressions (39), (45), and (59), the magnetic sensor device of the present invention may compare the signal component of the Hall element to the reference voltage while removing all offset components generated in the Hall element 1, the differential amplifier 3, and the amplifier 4, and hence highly-precise magnetic field intensity detection is realized. In an ideal Hall element, the common-mode voltages Vcmφ1 and Vcmφ2 in the first detection state and the second detection state are equal to each other. In an actual Hall element, however, the common-mode voltages Vcmφ1 and Vcmφ2 are not always equal to each other, which is also responsible for an error in highly-precise magnetic field intensity detection. In the magnetic sensor device of the present invention, as expressed by Expression (59), the terms of Vcmφ1 and Vcmφ2 are not included in the expression indicating the comparison result, and hence highly-precise magnetic field intensity detection without a non-ideal component of the common-mode voltage of the Hall element is realized.

As expressed by Expression (31), the reference voltage component ΔVref to be compared to the signal component of the Hall element may be arbitrarily set by the values of the reference voltage setting circuit Vref1 and the reference voltage setting circuit Vref2 in the first phase φ1 and the second phase φ2. In other words, in the magnetic sensor device of the present invention, the reference voltage may be arbitrarily set, and hence the magnetic field intensity to be detected may be arbitrarily set.

In general, the sensitivity of the Hall element depends on temperature, and hence the signal voltage corresponding to magnetic field intensity output from the Hall element 1 also depends on temperature. In order to correct the dependence, for example, temperature dependence is given to the reference voltage setting circuit Vref1 and the reference voltage setting circuit Vref2, to thereby suppress the temperature dependence of the magnetic field intensity to be detected.

Now, a description is given of an exemplary circuit configuration of the detection voltage setting circuit 5, which is a component of the magnetic sensor device of FIG. 1.

Figure 5:
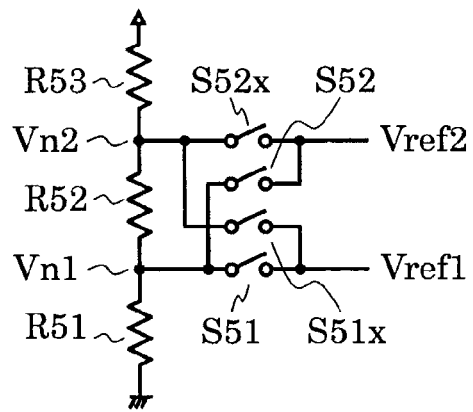
FIG. 5 is an exemplary circuit diagram of a detection voltage setting circuit used in the magnetic sensor device of the present invention.

FIG. 5 is an example of the detection voltage setting circuit 5.

The detection voltage setting circuit 5 of FIG. 5 includes resistors R51, R52, and R53 and switches S51, S51x, S52, and S52x, which are connected as follows. The resistors R51, R52, and R53 are connected in series between a positive power supply voltage terminal (hereinafter referred to as power supply voltage terminal) VDD and a negative power supply voltage terminal (hereinafter referred to as ground terminal) VSS. A connection point of the resistors R51 and R52 is represented by "Vn1", and a connection point of the resistors R52 and R53 is represented by "Vn2". The switches S51, SS1x, S52, and S52x each have two terminals, and are controlled to be turned ON or OFF in accordance with switch control signals (not shown). One terminal of the switch S51 is connected to the connection point Vn1, and the other terminal is connected to a positive terminal of the reference voltage setting circuit Vref1. One terminal of the switch S51x is connected to the connection point Vn2, and the other terminal is connected to the positive terminal of the reference voltage setting circuit Vref1. One terminal of the switch S52 is connected to the connection point Vn1, and the other terminal is connected to a positive terminal of the reference voltage setting circuit Vref2. One terminal of the switch S52x is connected to the connection point Vn2, and the other terminal is connected to the positive terminal of the reference voltage setting circuit Vref2. In the following description, voltages at the power supply voltage terminal VDD and the ground terminal VSS are represented by "VDD" and "VSS", respectively; voltages at the connection points Vn1 and Vn2, "Vn1" and "Vn2", respectively; voltages at the positive terminal of the reference voltage setting circuit Vref1 and the positive terminal of the reference voltage setting circuit Vref2, "reference voltage Vref1" and "reference voltage Vref2", respectively.

The detection voltage setting circuit 5 has the above-mentioned connections, and operates as follows.

The voltages at the connection points Vn1 and Vn2 are the following voltages obtained by dividing VDD and VSS by the resistors R51, R52, and R53, respectively.

$$Vn1=R51/(R51+R52+R53)\times(VDD-VSS) \quad (63)$$

$$Vn2=(R51+R52)/(R51+R52+R53)\times(VDD-VSS) \quad (64)$$

The voltages Vn1 and Vn2 can be set arbitrarily based on the resistors R51, R52, and R53.

The switches S51 and S51x are controlled so that one switch is turned ON and the other is turned OFF. Therefore, any one of the voltages Vn1 and Vn2 is output as the reference voltage Vref1. Similarly, the switches S52 and S52x are controlled so that one switch is turned ON and the other is turned OFF. Therefore, any one of the voltages Vn1 and Vn2 is output as the reference voltage Vref2.

Figure 6:
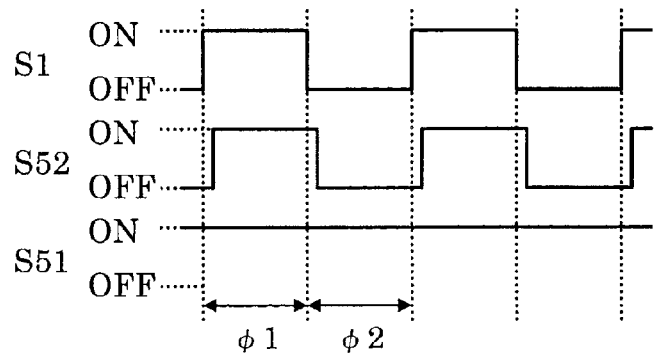
FIG. 6 is an exemplary timing chart of switch control signals in the first embodiment.

Now, it is assumed that the respective switches of the detection voltage setting circuit 5 illustrated in FIG. 5 are controlled by switch control signals of a timing chart illustrated in FIG. 6.

FIG. 6 illustrates the timing chart of the switch control signals.

As described above, the switch S1 is controlled by the switch control signal to be turned ON in the first phase ϕ1 and OFF in the second phase ϕ2. The switches S51 and S51x are controlled by the switch control signals. The switch S51 is turned ON both in ϕ1 and ϕ2, and the switch S51x is turned OFF both in ϕ1 and ϕ2. The switches S52 and S52x are controlled by the switch control signals. The switch S52 is turned ON in ϕ1 and OFF in ϕ2. The switch S51x is turned OFF both in ϕ1 and ϕ2. In this case, when the switch S1 is turned OFF, in order to prevent an error in a voltage charged in the capacitor C1 in the first phase ϕ1, it is necessary to delay the timing of switching the switches S52 and S52x as compared to the timing of turning OFF the switch S1. For clear illustration, the timings are exaggerated in the timing chart of FIG. 6. Note that, in the timing chart of FIG. 6, also when the switch S1 is turned ON, the timing of switching the switches S52 and S52x is delayed. However, when the switch S1 is turned ON, the timing of turning ON the switch S1 and the timing of switching the switches S52 and S52x may be the same. In contrast, the timing of switching the switches S52 and S52x may be earlier.

Through the above-mentioned control of the switches, the reference voltages Vref1 and Vref2 in the respective phases are determined as follows.

$$Vref1\phi1=Vn1$$

$$Vref1\phi2=Vn1$$

$$Vref2\phi1=Vn1$$

$$Vref2\phi2=Vn2$$

Based on the expressions above and Expression (31), Expression (65) is obtained.

$$\Delta Vref=(Vn2-Vn1) \quad (65)$$

Therefore, the voltage ΔVref to be compared to the signal component from the Hall element in the amplifier 4 is given as the difference between the voltages Vn1 and Vn2 that may be arbitrarily set. As described above, according to the magnetic sensor device of the present invention, the reference voltage may be arbitrarily set, in other words, the magnetic field intensity to be detected may be arbitrarily set.

Figure 7:
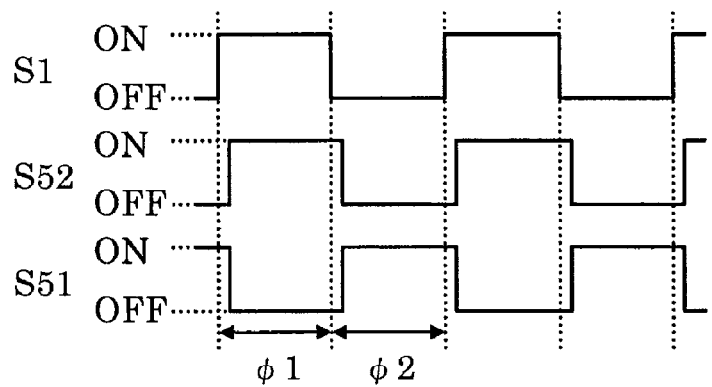
FIG. 7 is another exemplary timing chart of the switch control signals in the first embodiment.

Next, it is assumed that the respective switches of the detection voltage setting circuit 5 illustrated in FIG. 5 are controlled by switch control signals of a timing chart illustrated in FIG. 7.

FIG. 7 illustrates an exemplary timing chart of the switch control signals. The timing chart of FIG. 7 is different from the timing chart of FIG. 6 in that the switch S51 is turned OFF in ϕ1 and ON in ϕ2 and the switch S51x is turned ON in ϕ1 and OFF in ϕ2. Through the above-mentioned control of the switches, the reference voltages Vref1 and Vref2 in the respective phases are determined as follows.

$$Vref1\phi1=Vn2$$

$$Vref1\phi2=Vn1$$

$$Vref2\phi1=Vn1$$

$$Vref2\phi2=Vn2$$

Based on the above expressions and Expression (31), Expression (66) is obtained.

$$\Delta Vref=2\times(Vn2-Vn1) \quad (66)$$

Therefore, the voltage that is twice the voltage ΔVref obtained in the timing chart of FIG. 6 is obtained. Specifically, by switching the control of ON and OFF of the switches S51, S51x, S52, and S52x in the state where the values of the resistors R51, R52, and R53 are uniquely determined and the voltages at the connection points Vn1 and Vn2 are uniquely determined, the magnetic field intensity to be detected may be switched.

Figure 8:
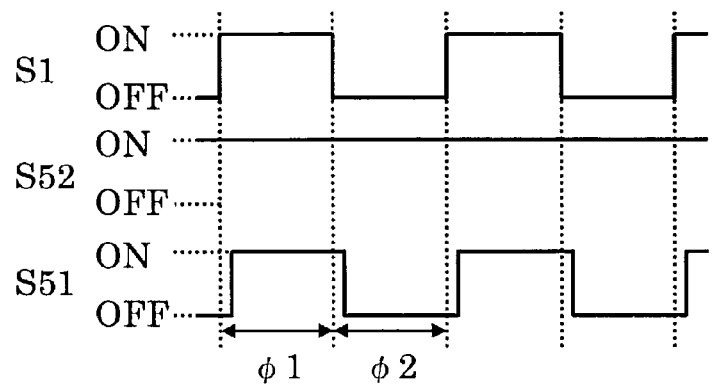
FIG. 8 is another exemplary timing chart of the switch control signals in the first embodiment.

Alternatively, it is assumed that the respective switches of the detection voltage setting circuit 5 illustrated in FIG. 5 are controlled by switch control signals of a timing chart illustrated in FIG. 8.

FIG. 8 illustrates an exemplary timing chart of the switch control signals. The timing chart of FIG. 8 is different from the timing chart of FIG. 6 in that the switch S51 is turned OFF in ϕ2, the switch S51x is turned ON in ϕ2, the switch S52 is turned ON both in the phases ϕ1 and ϕ2, and the switch S52x is turned OFF both in the phases ϕ1 and ϕ2.

Through the above-mentioned control of the switches, the reference voltages Vref1 and Vref2 in the respective phases are determined as follows.

$$Vref1\phi1=Vn1$$

$$Vref1\phi2=Vn2$$

$$Vref2\phi1=Vn1$$

$$Vref2\phi2=Vn1$$

Based on the above expressions and Expression (31), Expression (67) is obtained.

$$\Delta Vref=-(Vn2-Vn1) \quad (67)$$

Therefore, the voltage that is reverse in polarity to the voltage ΔVref obtained in the timing chart of FIG. 6 is obtained. In this case, the characteristics of the Hall element show that the polarity of the differential output voltage Vh to be output to the output terminal pair of the Hall element 1 is reversed between the S-pole and the N-pole. Specifically, the signal component input to the amplifier 4 is reversed in polarity between the detection of the S-pole and the detection of the N-pole. It is therefore necessary for the detection voltage setting circuit 5 to set detection voltages having reverse polarities. In the case of the timing chart of FIG. 8, ΔVref with the polarity reverse to that in the case of the timing chart of FIG. 6 is obtained, which satisfies the above-mentioned requirement. Specifically, by switching the switches to be turned ON and OFF between the first phase φ1 and the second phase φ2 so as to reverse the polarity of ΔVref, the detection may be performed while discriminating between the S-pole and the N-pole.

Figure 9:
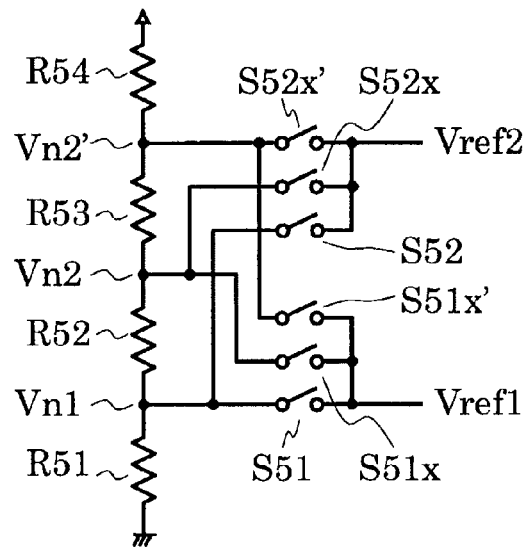
FIG. 9 is another exemplary circuit diagram of the detection voltage setting circuit used in the magnetic sensor device of the present invention.

FIG. 9 illustrates another example of the detection voltage setting circuit 5.

FIG. 9 is an example of the detection voltage setting circuit 5. FIG. 9 is different from FIG. 5 in that a resistor R54 and switches S51x' and S52x' are added. The added components are configured and connected as follows. The resistor R54 is connected in series between the power supply voltage terminal VDD and the resistor R53 of FIG. 5. A connection point between the resistors R53 and R54 is referred to as "Vn2'". Each of the switches S51x' and S52x' has two terminals, and is controlled to be turned ON or OFF in accordance with a switch control signal (not shown). One terminal of the switch S51x' is connected to the connection point Vn2', and the other terminal thereof is connected to the positive terminal of the reference voltage setting circuit Vref1. One terminal of the switch S52x' is connected to the connection point Vn2', and the other terminal thereof is connected to the positive terminal of the reference voltage setting circuit Vref2. The other components than the added ones are connected similarly to FIG. 5.

The detection voltage setting circuit 5 is connected as described above, and operates as follows.

The voltages at the connection points Vn1, Vn2, and Vn2' are the following voltages obtained by dividing VDD and VSS by the resistors R51, R52, R53, and R54.

$$Vn1=R51/(R51+R52+R53+R54)\times(VDD-VSS) \quad (68)$$

$$Vn2=(R51+R52)/(R51+R52+R53+R54)\times(VDD-VSS) \quad (69)$$

$$Vn2=(R51+R52+R53)/(R51+R52+R53+R54)\times(VDD-VSS) \quad (70)$$

The voltages Vn1, Vn2, and Vn2' may be arbitrarily set by the resistors R51, R52, R53, and R54.

The switches S51, S51x, and S51x' are controlled so that the switches S51x and S51x' are both turned OFF when the switch S51 is turned ON and that one of the switches S51x and S51x' is turned ON and the other is turned OFF when the switch S51 is turned OFF. Similarly, the switches S52, S52x, and S52x' are controlled so that the switches S52x and S52x' are both turned OFF when the switch S52 is turned ON and that one of the switches S52x and S52x' is turned ON and the other is turned OFF when the switch S52 is turned OFF. The switches S51x' and S52x' are provided to provide hysteresis to the detection voltage. In the case where magnetic field intensity is detected by a detection voltage set by the switch S51x' or S52x', the switch to be turned ON in the next detection period T is changed from S51x' to S51x or from S52x' to S52x. Similarly, in the case where magnetic field intensity detection is cancelled, the switch to be turned ON in the next detection period T is changed from S51x to S51x' or from S52x to S52x'. In this way, chattering generated at the time of magnetic field intensity detection and cancelling may be suppressed.

In conclusion, as described above with reference to FIGS. 5 to 9, the magnetic sensor device of the present invention may realize arbitrary setting of the magnetic field intensity to be detected by the magnitude and polarity of the voltage component ΔVref supplied from the detection voltage setting circuit 5 to the amplifier 4, easy discrimination between the S-pole and the N-pole, and easy setting of hysteresis between the detection and cancelling. Those various functions of the circuit configuration in this embodiment are achieved by not only the circuit configuration of the detection voltage setting circuit 5 illustrated in FIGS. 5 and 9 but also the circuit configuration in which, as expressed by Expression (31), the reference voltage component ΔVref may be set by the voltages of the reference voltage setting circuit Vref1 and the reference voltage setting circuit Vref2 in the first phase φ1 and the second phase φ2.

Now, a description is given of an exemplary circuit configuration of the amplifier 4, which is a component of the magnetic sensor device of FIG. 1. The function of the amplifier 4 illustrated in the conceptual diagram of FIG. 3 is more specifically realized by a circuit configuration illustrated in FIG. 10, for example.

Figure 10:
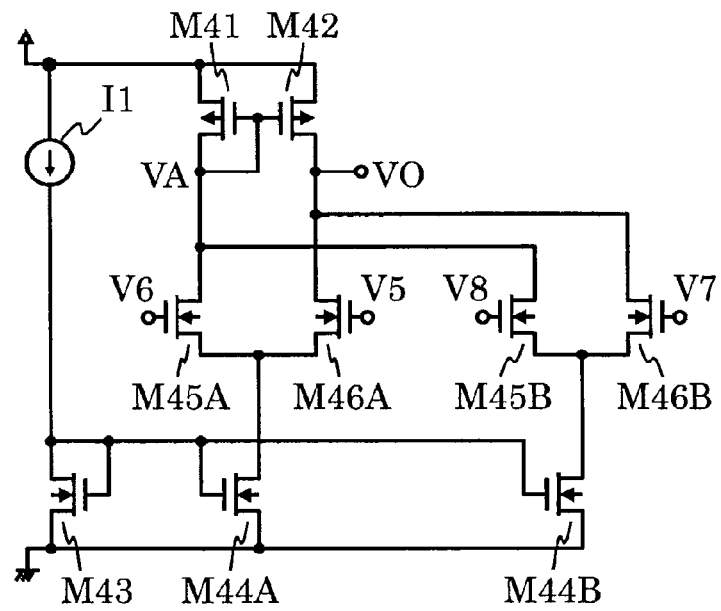
FIG. 10 is an exemplary circuit diagram of the amplifier used in the first embodiment.

FIG. 10 is an exemplary circuit configuration of the amplifier 4.

The amplifier 4 includes a constant current circuit I1, NMOS transistors M43, M44A, M44B, M45A, M46A, M45B, and M46B, and PMOS transistors M41 and M42, which are connected as follows. One terminal of the constant current circuit I1 is connected to the power supply voltage terminal VDD, and the other terminal thereof is connected to a drain and a gate of the NMOS transistor M43. This connection point is referred to as "VBN". VBN is connected to a gate of the NMOS transistor M44a and a gate of the NMOS transistor M44b. A source of each of the NMOS transistors M43, M44A, and M44B is connected to the ground terminal VSS. A source of each of the NMOS transistors M45A and M46A is connected to a drain of the NMOS transistor M44A. A source of each of the NMOS transistors M45B and M46B is connected to a drain of the NMOS transistor M44B. A drain of each of the NMOS transistors M45A and M45B is connected to a drain of the PMOS transistor M41. This connection point is referred to as "VA". A drain of each of the NMOS transistors M46A and M46B is connected to a drain of the PMOS transistor M42. This connection point is connected to the output terminal VO of the amplifier 4. A gate of each of the PMOS transistors M41 and M42 is connected to the connection point VA, and a source thereof is connected to the power supply voltage terminal VDD. Gates of the NMOS transistors M45A and M46A are connected to the second input terminal V6 and the first input terminal V5 of the first differential input pair, respectively. Gates of the NMOS transistors M45B and M46B are connected to the second input terminal V8 and the first input terminal V7 of the second differential input pair, respectively.

The amplifier 4 is connected as described above, and operates as follows.

The constant current circuit I1 generates a constant current to be supplied to the NMOS transistor M43. The NMOS transistors M43, M44A, and M44B form a current mirror circuit. A current based on a current flowing between the drain and source of the NMOS transistors M43 flows between the drain and source of each of the NMOS transistors M44A and M44B. Five transistors of the NMOS transistors M44A, M45A, and M46A and the PMOS transistors M41 and M42 form a differential amplifier, which operates to amplify a gate voltage difference of the NMOS transistors M45A and M46A that form the first differential input pair, that is, a voltage difference between the second input terminal V6 of the first differential input pair and the first input terminal V5 of the first differential input pair, and output the amplified voltage difference to the output terminal VO. This gain is referred to as "A1". The operations of the current mirror circuit configuration and the differential amplifier configuration are described in detail in the literature of CMOS analog circuits and the like, and the detailed description is herein omitted. Similarly, five transistors of the NMOS transistors M44B, M45B, and M46B and the PMOS transistors M41 and M42 form a differential amplifier, which operates to amplify a gate voltage difference between the NMOS transistors M45B and M46B that form the second differential input pair, that is, a voltage difference between the second input terminal V8 of the second differential input pair and the first input terminal V7 of the second differential input pair, and output the amplified voltage difference to the output terminal VO. This gain is referred to as "A2". The drain of the NMOS transistor M45A forming the first differential input pair and the drain of the NMOS transistor M45B forming the second differential input pair are connected to the drain of the PMOS transistor M41 at the connection point VA. The drain of the NMOS transistor M46A forming the first differential input pair and the drain of the NMOS transistor M46B forming the second differential input pair are connected to the drain of the PMOS transistor M42 at the output terminal VO. The amplifier 4 operates so that the voltages obtained by amplification by the first differential input pair and the second differential input pair are added at the connection point VA and the output terminal VO. This operation is expressed as follows.

$$VO = A1 \times (V6-V5) + A2 \times (V8-V7) \quad (71)$$

In other words, the operation similar to Expression (14) is performed.

Figure 11:
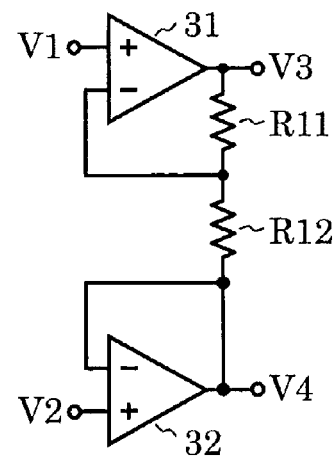
FIG. 11 is another exemplary circuit diagram of the differential amplifier used in the magnetic sensor device of the present invention.

The operation of the magnetic sensor device according to the first embodiment of the present invention has been described above to show that highly-precise magnetic detection may be realized. In the description above, the specific circuit configurations and timing chart for the differential amplifier 3, the amplifier 4, and the detection voltage setting circuit 5 according to the first embodiment have been described. However, this embodiment is not necessarily limited to this configuration as long as the operation described above may be performed. For example, the specific configuration of the differential amplifier 3 is not limited to FIG. 2. As illustrated in FIG. 11, the resistor R13 may be removed for direct connection. The gain G of the differential amplifier 3 in this case is expressed by Expression (72) which is modified from the gain expression of Expression (13) with a minimum value of the resistor R13.

$$G = (R11+R12)/R12 \quad (72)$$

This does not deviate from the gist of the present invention, that is, realizing highly-precise magnetic detection.

The above description shows that the detection may be performed while discriminating between the S-pole and the N-pole, but the magnetic sensor device of the present invention is also applicable to bipolar detection (such as motor rotation detection). The bipolar detection is performed by a magnetic sensor device in a manner that the state of detecting only one pole (for example, S-pole) is switched to the state of detecting only the other pole (N-pole) after the one pole is detected.

Further, in the timing chart of FIG. 4, 6, 7, or 8, there may be employed a driving method in which a standby period of a given period of time is provided between one detection period T and another detection period T to suppress average current consumption of the magnetic sensor device. Also in this case, the effect of highly-precise magnetic detection may be obtained.

Note that, a description has been given above of the magnetic sensor device using a magnetoelectric conversion element. Alternatively, however, the device of the present invention may use, instead of using a magnetoelectric conversion element for outputting a voltage corresponding to magnetic field intensity, a conversion element for similarly outputting a voltage corresponding to an acceleration or a pressure.

Second Embodiment

Figure 12:
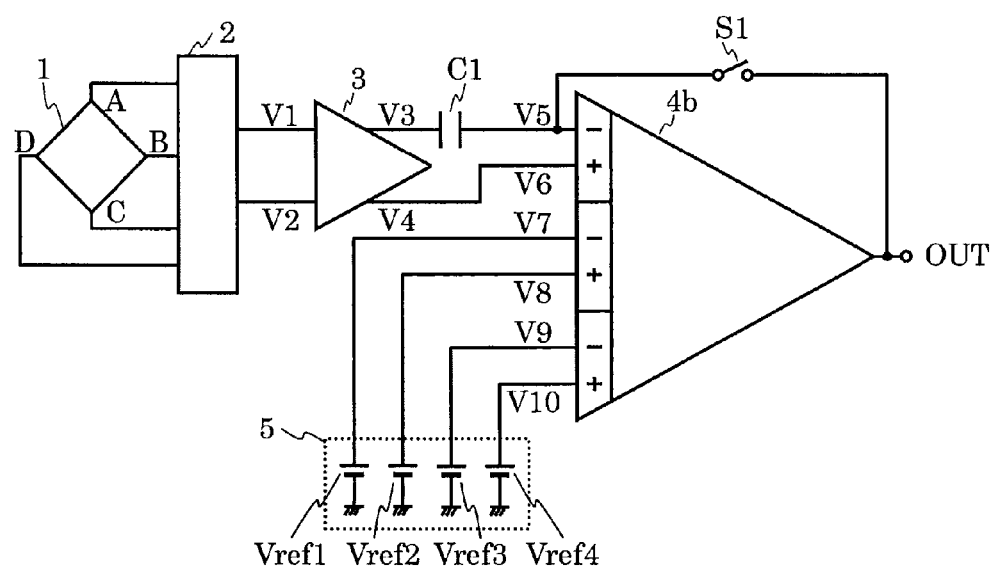
FIG. 12 is a circuit diagram of a magnetic sensor device according to a second embodiment of the present invention.

FIG. 12 is a circuit diagram of a magnetic sensor device according to a second embodiment of the present invention. The differences from the first embodiment illustrated in FIG. 1 reside in that the amplifier 4 is changed to an amplifier 4b and that the configuration of the detection voltage setting circuit 5 is changed. The differences of the amplifier 4b from the amplifier 4 reside in that a third differential input pair is added and that a first input terminal V9 of the third differential input pair and a second input terminal V10 of the third differential input pair are added. The detection voltage setting circuit 5 is changed so that a reference voltage setting circuit Vref3 and a reference voltage setting circuit Vref4 are added. The first input terminal V9 of the third differential input pair of the amplifier 4b is connected to a positive terminal of the reference voltage setting circuit Vref3, and the second input terminal V10 of the third differential input pair of the amplifier 4b is connected to a positive terminal of the reference voltage setting circuit Vref4. The other connections and configurations are the same as in the first embodiment.

Figure 13:
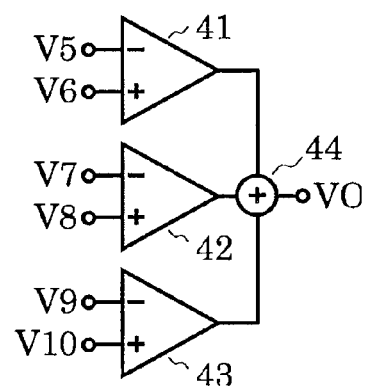
FIG. 13 is an exemplary circuit diagram of an amplifier used in the second embodiment.

FIG. 13 is a conceptual diagram illustrating the function of the amplifier 4b.

The difference of the amplifier 4b illustrated in FIG. 13 from the amplifier 4 illustrated in FIG. 3 resides in that a differential amplifier 43 and its input terminals V9 and V10 are added. The first input terminal V9 of the third differential input pair of the amplifier 4b is connected to an inverting input terminal of the differential amplifier 43, and the second input terminal V10 of the third differential input pair is connected to a non-inverting input terminal of the differential amplifier 43. An output of the differential amplifier 43 is connected to an input of an adder 44. The other connections and configurations are the same as in the amplifier 4 illustrated in FIG. 3. The differential amplifier 43 operates similarly to the differential amplifiers 41 and 42. The differential amplifier 43 amplifies a difference of voltages of the two input terminals V9 and V10 and inputs the amplified difference to the adder 44. The adder 44 outputs the sum of the outputs of the differential amplifier 41 and the differential amplifier 42 and the output of the differential amplifier 43. This amplifier function is expressed by the expression as follows by adding the term of the differential amplifier 43 to Expression (14).

$$VO=A1\times(V6-V5)+A2\times(V8-V7)+A3\times(V10-V9) \quad (73)$$

where A3 is the gain of the differential amplifier 43.

The operation of the magnetic sensor device according to the second embodiment of the present invention is described similarly to that of the operation of the magnetic sensor device according to the first embodiment, and is expressed by the following expression as a result.

The output of the amplifier 4b in the second phase φ2 is expressed by the following expression similarly to Expression (29).

$$VO\phi2=A1\times[\Delta Vsig+(A2/A1)\times\Delta Vref] \quad (74)$$

The signal component ΔVsig is expressed by the following expressions similarly to Expressions (30) and (33).

$$\Delta Vsig=-(V3\phi2-V4\phi2)+(V3\phi1-V4\phi1) \quad (75)$$

$$\Delta Vsig=G\times\{(V1\phi2-V2\phi2)-(V1\phi1-V2\phi1)\} \quad (76)$$

Further, the reference voltage component ΔVref is expressed by the following expression by adding the terms of the reference voltage setting circuit Vref3 and the reference voltage setting circuit Vref4 to Expression (31).

$$\Delta Vref=(Vref2\phi2-Vref1\phi2)-(Vref2\phi1-Vref1\phi1)+ \\ (Vref4\phi2-Vref3\phi2)-(Vref4\phi1-Vref3\phi1) \quad (77)$$

The above description of the magnetic sensor device in the first embodiment shows the multifunctionality, such as enabling arbitrary setting of magnetic field intensity to be detected, discrimination between the S-pole and the N-pole, and hysteresis setting between detection and cancellation, by appropriately setting the voltages of the reference voltage setting circuit Vref1 and the reference voltage setting circuit Vref2 in the first phase φ1 and the second phase φ2. However, in this circuit configuration, the voltages of the reference voltage setting circuit Vref3 and the reference voltage setting circuit Vref4 can further appropriately set in the first phase φ1 and the second phase φ2, which suggests that a wider magnetic field detection function can be realized. Further, the above description of the magnetic sensor device in the first embodiment shows that, by giving temperature dependence to the reference voltage setting circuit Vref1 and the reference voltage setting circuit Vref2, temperature dependence of the sensitivity of the Hall element can be corrected to suppress temperature dependency of magnetic field intensity to be detected. However, in this configuration, for example, the reference voltage setting circuit Vref1 and the reference voltage setting circuit Vref2 are each configured to output a temperature-independent reference voltage, and the reference voltage setting circuit Vref3 and the reference voltage setting circuit Vref4 are each configured to output a temperature-dependent reference voltage. In this manner, the detection magnetic field intensity at the reference temperature can be set by Vref1 and Vref2, and the temperature correction amount from the reference temperature can be set by Vref3 and Vref4.

Now, a description is given of an exemplary circuit configuration of the amplifier 4b serving as the element constructing the magnetic sensor device of FIG. 12. More specifically, the function of the amplifier 4b illustrated in the conceptual diagram of FIG. 13 can be realized by such a circuit configuration as illustrated in FIG. 14, for example.

Figure 14:
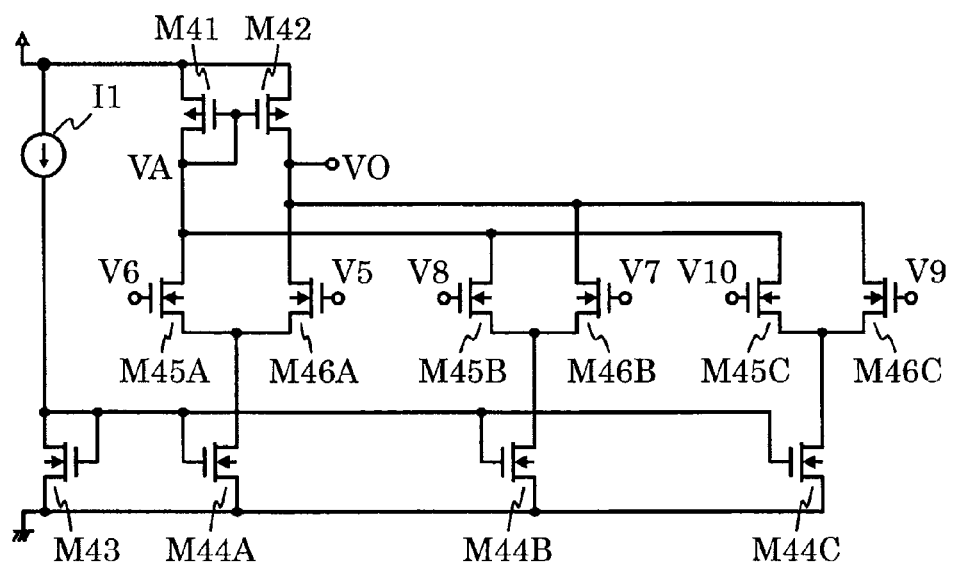
FIG. 14 is an exemplary circuit diagram of the amplifier used in the second embodiment.
Figure 15:
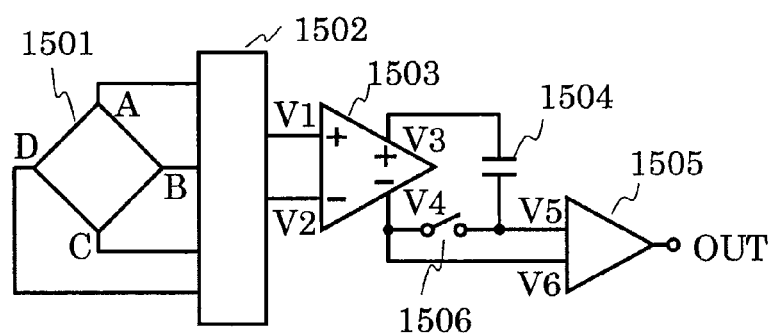
FIG. 15 is a circuit diagram of a related-art magnetic sensor device.

FIG. 14 is an exemplary circuit configuration of the amplifier 4b.

The difference of the amplifier 4b from the amplifier 4 resides in that NMOS transistors M44C, M45C, and M46C are added. The added elements are connected to the configuration of the amplifier 4 as follows. A source of the NMOS transistor M44C is connected to the ground terminal VSS. Sources of the NMOS transistors M45C and M46C are connected to a drain of the NMOS transistor M44C. A drain of the NMOS transistor M45C is connected to a connection point VA. A drain of the NMOS transistor M46C is connected to the output terminal VO. Gates of the NMOS transistors M45C and M46C are connected to the second input terminal V10 and the first input terminal V9 of the third differential input pair, respectively. The other connections and configurations are the same as in the amplifier 4 illustrated in FIG. 10.

The amplifier 4b is connected as describe above, and operates as follows. The additional configurations from the amplifier 4 are now described.

The NMOS transistors M43 and M44C form a current mirror circuit. A current based on the current flowing between the drain and source of the NMOS transistor M43 flows between the drain and source of the NMOS transistor M44C. Five transistors of the NMOS transistors M44C, M45C, and M46C and the PMOS transistors M41 and M42 form a differential amplifier, which operates to amplify a gate voltage difference of the NMOS transistors M45C and M46C of the third differential input pair, that is, a voltage difference between the second input terminal V10 of the third differential input pair and the first input terminal V9 of the first differential input pair, and output the amplified voltage difference to the output terminal VO. This gain is referred to as "A3". The drain of the NMOS transistor M45A of the first differential input pair, the drain of the NMOS transistor M45B of the second differential input pair, and the drain of the NMOS transistor M45C of the third differential input pair are connected to the drain of the PMOS transistor M41 at the node VA. The drain of the NMOS transistor M46A of the first differential input pair, the drain of the NMOS transistor M46B of the second differential input pair, and the drain of the NMOS transistor M46C of the third differential input pair are connected to the drain of the PMOS transistor M42 at the output terminal VO. With those connections, the differential amplifier operates so that the voltages amplified by the first differential input pair, the second differential input pair, and the third differential input pair are added at the connection point VA and the output terminal VO. Those operations are expressed as follows.

$$VO=A1\times(V6-V5)+A2\times(V8-V7)+A3\times(V10-V9) \quad (78)$$

which shows that the operation similar to Expression (73) is performed.

What is claimed is:

1. A sensor device for generating a logic output in accordance with intensity of a physical quantity applied to a sensor element, the sensor device comprising:
    a switch circuit, which is connected to a first terminal pair and a second terminal pair of the sensor element, for controlling switching between a terminal pair supplied with power and a terminal pair for outputting a detection voltage corresponding to the intensity of the physical quantity,
        the switch circuit comprising a first output terminal for outputting the detection voltage and a second output terminal for outputting the detection voltage;
    a differential amplifier comprising: a first input terminal and a second input terminal, which are connected to the first output terminal and the second output terminal of the switch circuit, respectively; and a first output terminal and a second output terminal for outputting a result of differentially amplifying the detection voltage;

an amplifier comprising a first input terminal, a second input terminal, a third input terminal, a fourth input terminal, and an output terminal, the first input terminal of the amplifier being connected to the output terminal of the amplifier via a first switch, the first input terminal of the amplifier being connected to the first output terminal of the differential amplifier via a first capacitor, the second input terminal of the amplifier being connected to the second output terminal of the differential amplifier; and a detection voltage setting circuit for outputting different voltages to the third input terminal and the fourth input terminal of the amplifier.

2. A sensor device according to claim 1, wherein the detection voltage setting circuit comprises a plurality of resistors connected in series between a power supply terminal and a ground terminal, and has at least three voltage dividing points, and wherein the detection voltage setting circuit further comprises:

a second switch provided between the first voltage dividing point and the third input terminal of the amplifier;

a third switch provided between the second voltage dividing point and the third input terminal of the amplifier;

a fourth switch provided between the third voltage dividing point and the third input terminal of the amplifier;

a fifth switch provided between the first voltage dividing point and the fourth input terminal of the amplifier;

a sixth switch provided between the second voltage diving point and the fourth input terminal of the amplifier; and a seventh switch provided between the third voltage dividing point and the fourth input terminal of the amplifier.

3. A sensor device according to claim 1, wherein the switch circuit has a function of switching between:

a first detection state in which power is supplied to the first terminal pair of the sensor element and the detection voltage is output from the second terminal pair; and a second detection state in which power is supplied to the second terminal pair of the sensor element and the detection voltage is output from the first terminal pair.

4. A sensor device according to claim 1, wherein the amplifier comprises at least two differential input pairs, wherein at least one of the at least two differential input pairs inputs a differential signal output from the differential amplifier, and wherein at least one of the at least two differential input pairs inputs a reference signal corresponding to a physical quantity to be detected.

5. A sensor device according to claim 1, wherein the physical quantity comprises magnetism.

6. A sensor device according to claim 1, wherein the physical quantity comprises pressure.

* * * * *